United States Patent [19]
Ichikawa et al.

[11] Patent Number: 4,747,036
[45] Date of Patent: May 24, 1988

[54] FAULT DETECTOR APPARATUS HAVING SERIAL FAULT-DETECTION SIGNAL PATH

[75] Inventors: Kohsaku Ichikawa, Tokyo; Yukinori Tsuruta, Sagamihara; Yuji Hashiya, Yokohama, all of Japan

[73] Assignee: Kabushiki Kaisha Toshiba, Kawasaki, Japan

[21] Appl. No.: 941,836

[22] Filed: Dec. 15, 1986

[30] Foreign Application Priority Data
Dec. 16, 1985 [JP] Japan .................. 60-282405

[51] Int. Cl.$^4$ .......................... H02H 7/125
[52] U.S. Cl. ........................ 363/54; 363/57; 363/68
[58] Field of Search .............. 363/540, 55, 56, 57, 363/58, 68

[56] References Cited

U.S. PATENT DOCUMENTS

| | | | |
|---|---|---|---|
| 3,842,337 | 10/1974 | Ekstrom et al. | 363/68 |
| 3,878,448 | 4/1975 | Jackson et al. | 363/68 |
| 4,384,248 | 5/1983 | Matsuda et al. | 363/58 |
| 4,464,585 | 8/1984 | Seki | 307/252 C |
| 4,597,038 | 6/1986 | Stacey | 363/57 |

Primary Examiner—Patrick R. Salce
Assistant Examiner—Jeffrey Sterrett
Attorney, Agent, or Firm—Oblon, Fisher, Spivak, McClelland & Maier

[57] ABSTRACT

A fault detector apparatus for a power converter in which a plurality of GTOs, functioning at a predetermined potential, are used. The apparatus includes a first fault-detecting circuit, coupled to the gate-cathode path of one of the GTOs, for generating a first fault signal when this GTO malfunctions, a second fault-detecting circuit, coupled to the gate-cathode path of another one of the GTOs, for generating a second fault signal when this GTO malfunctions, a photocoupler for transmitting a DC-isolated optical signal corresponding to the first fault signal, and one optical fiber system for transmitting a DC-isolated output signal, corresponding to the logical sum of the optical signal transmitted by the photocoupler and the second fault signal, to external circuits set at a potential different from the potential at which the GTOs are arranged. The fault-detecting circuits are provided in the same number as the GTOs. The fault-detecting circuits are coupled by the optical signals.

11 Claims, 4 Drawing Sheets

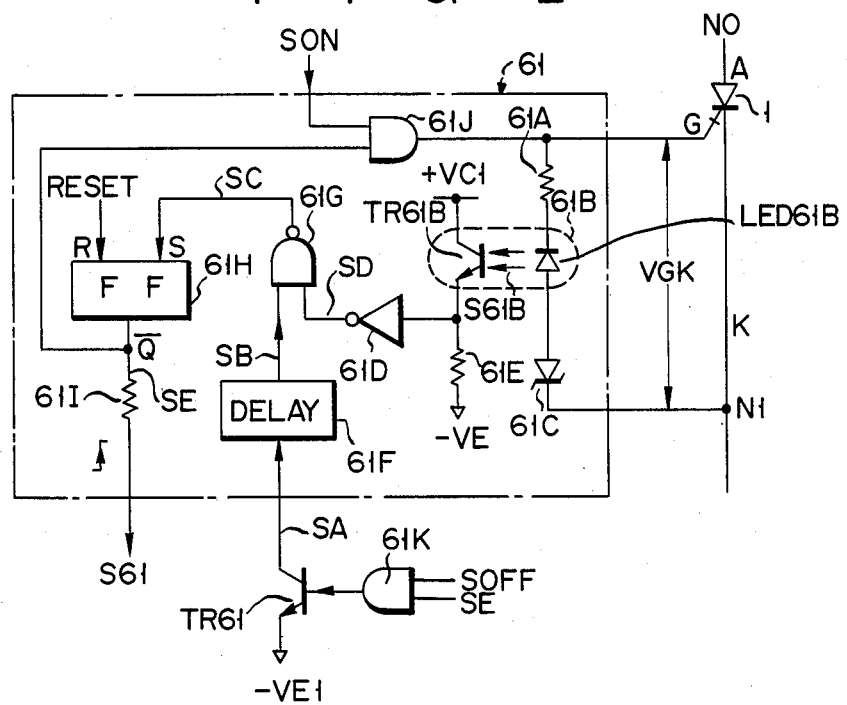
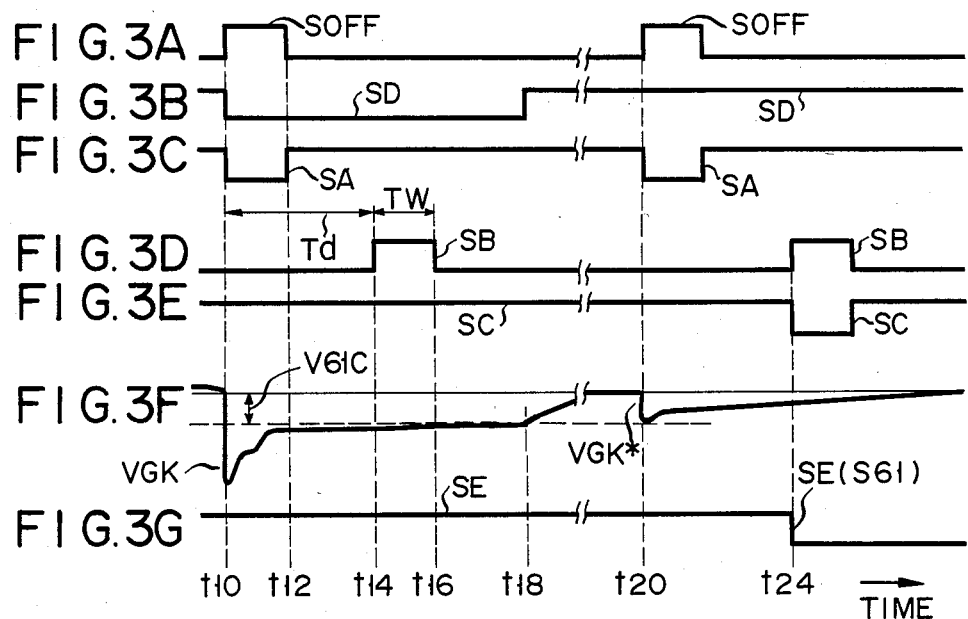

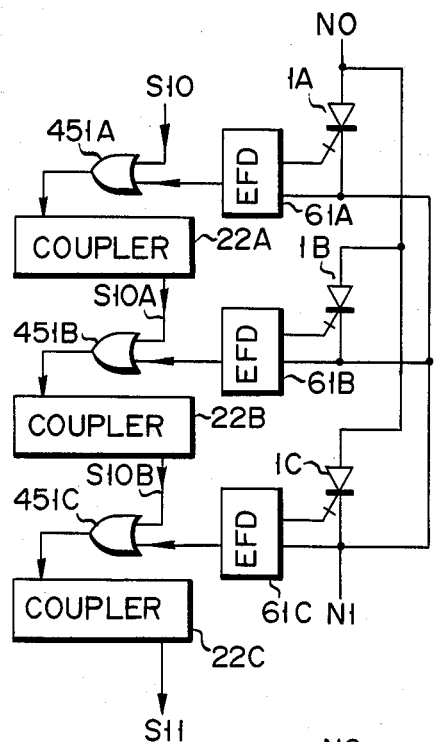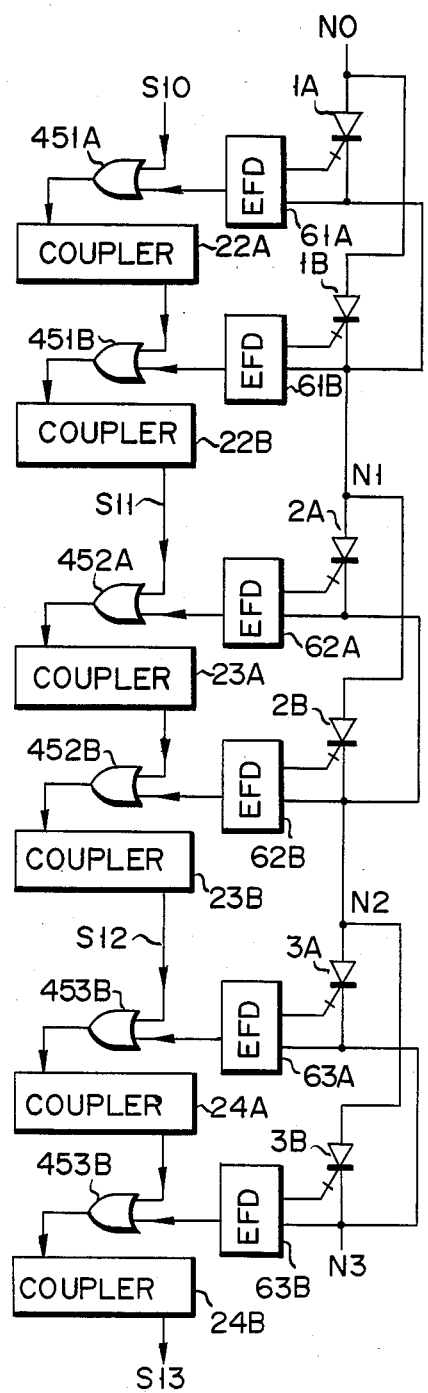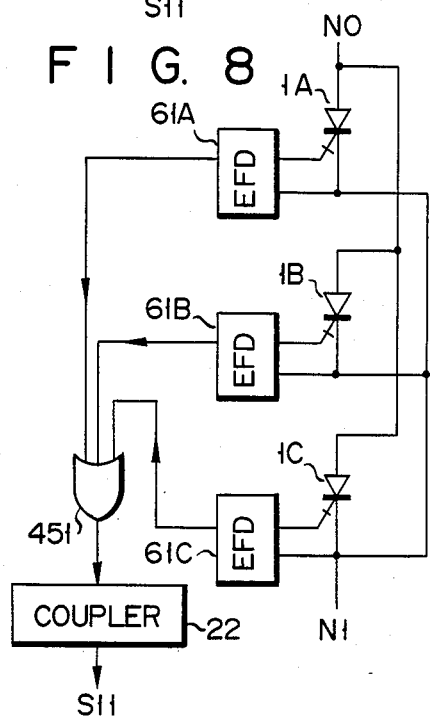

4,747,036

FAULT DETECTOR APPARATUS HAVING SERIAL FAULT-DETECTION SIGNAL PATH

BACKGROUND OF THE INVENTION

This invention relates to an apparatus for detecting faulty self-extinguishing switching elements coupled in series within a power conversion apparatus.

Apparatuses for detecting a fault of self-extinguishing switching elements, such as gate turnoff thyristors (GTO), connected in series within an inverter device, are known. Each of these apparatuses outputs signals of greatly different DC potentials upon detecting faulty switching elements. Such an apparatus is disclosed in, for example, U.S. Pat. No. 3,842,337 (Ekstoem et al.) and U.S. Pat. No. 3,878,448 (Jackson et al.) (All the technical disclosures of these U.S. patents are incorporated by reference in this specification.) In each of these conventional apparatuses, a plurality of element fault detectors are respectively coupled to series-connected thyristors, forming a thyristor rectifier of a high withstanding voltage. Each detector generates an output when it detects that the corresponding thyristor has a fault. The output is supplied to a protection control circuit through an optical fiber (i.e., a light guide). The optical fiber provides a DC isolation between the detector (at high potential) and the control circuit (at low potential).

Both conventional apparatuses have drawbacks. In a power conversion apparatus, the higher its withstanding voltage, and the greater its power capacity, the more thyristors must be connected in series to constitute one arm of each thyristor bridge, and the more detectors must be coupled to the thyristors. The apparatus will inevitably require more elements, and more optical fibers to transmit the output of the detectors.

SUMMARY OF THE INVENTION

It is an object of the present invention to provide an apparatus which requires only one light guide for one arm of a bridge consisting of a plurality of switching elements, and in which a signal representative of any faulty switching element can be transmitted to a low-potential circuit.

In the present invention, to accomplish the above object, a plurality of DC-isolation type malfunction signal transmitting means, e.g., photocouplers (21-25), are provided. Each means is provided between any adjacent two switching elements, and the fault signals from these means can be transmitted to the low-potential circuit via a single light guide.

BRIEF DESCRIPTION OF THE DRAWINGS

FIG. 2 is a circuit diagram showing the internal structure of a detector (61) for detecting faulty elements;

FIGS. 3A through FIG. 3G are timing charts explaining the operation of the detector shown in FIG. 2;

FIG. 7 shows a circuit containing three GTOs (1A-1C) connected in parallel, and three series-connected detector units which are identical with the unit (11) shown in FIG. 1 and connected to the three GTOs, respectively;

FIG. 8 shows a modification of the circuit shown in FIG. 7, containing detector units more simple than those shown in FIG. 7; and FIG. 9 shows a circuit containing three sets of two-GTO parallel circuits connected in series, forming a GTO arm, and detector units which are identical with those shown in FIG. 1, provided in the same number as the GTOs, and are connected in series.

DETAILED DESCRIPTION OF THE PREFERRED EMBODIMENTS

Some embodiments of the invention will now be described with reference to the accompanying drawings. All elements of the first embodiment will be described, and those elements of any other embodiment which are the same as those of the first embodiment will not be described, but will be designated by the same numerals used to denote their equivalents in the first embodiment.

Figure 1:
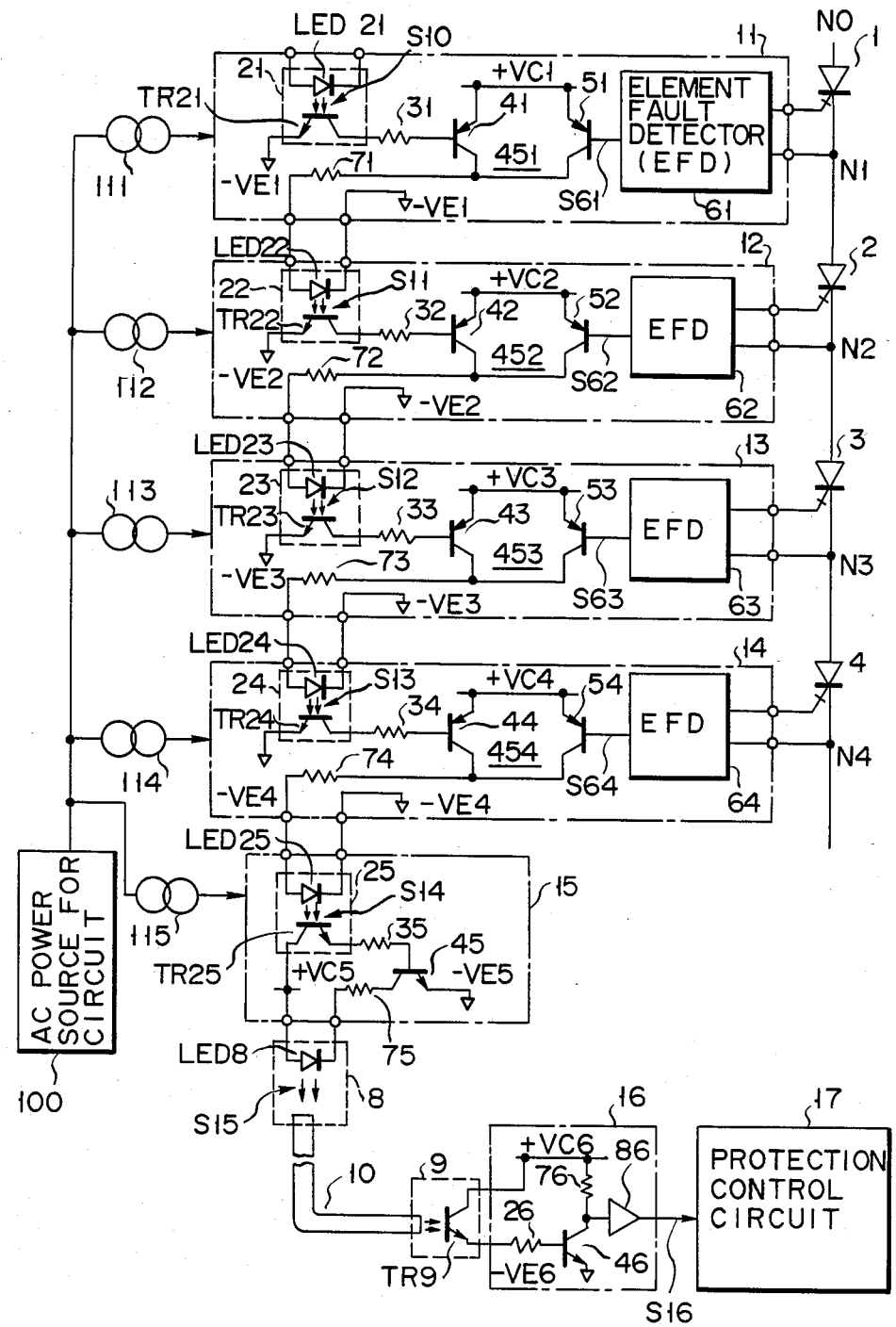
FIG. 1 is a circuit diagram showing an element fault-detecting apparatus according to one embodiment of the present invention.

FIG. 1 shows the first embodiment of the present invention, i.e., an apparatus for detecting faulty self-extinguishing switching elements connected in series within a power conversion apparatus. As is shown in FIG. 1, the apparatus comprises optically-isolated circuits (fault detector units) 11-14, including element fault-detector (EFDs) 61-64. Optically-isolated circuits 11-14 include photocouplers (optical isolation elements) 21-24; resistors 31-34; resistors 71-74, transistors 41-44, and transistors 51-54. The apparatus also includes optical signal-driving circuit (fault signal-transmitting unit) 15. Circuits 11-14 and circuit 15 are both at high potential.

The apparatus further comprises high-luminance LED (light-emitting element) 8, light guide (optical fiber) 10, phototransistor (light-receiving element) TR9, photoelectric transducer circuit (fault signal-receiving unit) 16 and protection control circuit 17. Circuit 16 is at low potential. A fault signal is supplied to protection control circuit 17 through element 8, guide 10, and element 9.

Circuits 11-14 have the same internal structure, so only circuit 11 will be described. As shown in FIG. 1, circuit 11 comprises photocoupler 21, including NPN phototransistor TR21. The ground potential $-VE1$ is applied to the emitter of phototransistor TR21. The collector of phototransistor TR21 is coupled, via resistor 31, to the base of PNP transistor 41. Circuit power source potential $+VC1$ is applied to the emitter of transistor 41. The collector of transistor 41 is connected, via resistor 71, to the anode of light-emitting diode (LED) 22 included in photocoupler 22 of circuit 12. Ground potential $-VE1$ is applied to the cathode of LED 22. The emitter and collector of PNP transistor 51 are connected to the emitter and collector of transistor 41, respectively. EFD 61 supplies fault signal S61 to the base of transistor 51. Transistors 41 and 51 form OR circuit 451, which provides a logic sum of the outputs of TR21 and fault signal S61.

Photocoupler 22 supplies fault signal S11 from circuit 11 to circuit 12. The DC isolation between circuits 11 and 12 is accomplished by photocoupler 22. Since the coupling of circuits 11 and 12 is optically performed by photocoupler 22, a DC signal component of signal S11 can be transmitted from circuit 11 to circuit 12 despite the potential difference of, for example, 1 kV between circuit 11 (at −VE1) and circuit 12 (at −VE2).

Similarly, circuits 12 and 13 are optically coupled by photocoupler 23 and DC isolation is secured between them, and circuits 13 and 14 are optically coupled by photocoupler 24 and DC isolation is secured between them.

As is shown in FIG. 1, optical signal-driving circuit 15 comprises photocouplers 25, resistors 35 and 75, and NPN transistor 45. Photoelectric transducer circuit 16 comprises resistors 26 and 76, NPN transistor 46, and IC gate 86. Photocoupler 25 connects circuits 14 and 15, so that fault signal S14 can be supplied from circuit 14 to circuit 15 through photocoupler 25. Power source potential +VC5 is applied to the collector of NPN transistor TR25. The emitter of this transistor is coupled, via resistor 35, to the base of NPN transistor 45. The collector of transistor 45 is connected to the power supply circuit of +VC5, via resistor 75 and high-luminance LED 8.

Optical output S15 from LED 8 is transmitted, via light guide 10, to NPN phototransistor TR9. Power supply potential +VC6 is applied to the collector of phototransistor TR9, the emitter of which is coupled, via resistor 26, to the base of NPN transistor 46. Ground potential −VE6 is applied to the emitter of transistor 46. The collector of transistor 46 is coupled to the power supply circuit of +VC6, via resistor 76. The collector of transistor 46 is connected to protection control circuit 17 via gate butter logic 86. Fault signal S16 corresponding to optical output S15 of LED 8 can thus be supplied from transistor 46 to circuit 17.

Protection control circuit 17 is a conventional one. Upon receipt of faulty signal S16, it stops a power converter including GTOs 1–4.

When GTOs 1–4 form one arm of an inverter, nodes N0–N4 of this arm are at a potential far higher than the ground potential. Therefore, power is supplied to circuits 11–15 through isolation transformers 111–115. For example, AC power is supplied to circuit 11 through transformer 111. Circuit 11 has a rectifier circuit (not shown) and a DC regulator (not shown). (Circuits 12 to 15 also have a rectifier circuit and a DC regulator.) The rectifier circuit rectifies the AC power supplied from transformer 111, thus producing a DC output. The DC regulator stabilizes the DC output, thereby providing DC power supplies, +VC1 and −VE1.

EFDs 61–64 are connected to GTOs 1–4, respectively. Each EFD can detect whether or not the associated GTO is a faulty one, by detecting the gate-cathode impedance of the GTO. This is because the impedance has a specific value while the GTO is correctly functioning, and has a different value when the GTO malfunctions. EFDs 61–64 and their operations will be described with reference to the circuit diagram of FIG. 2 and the timing charts of FIGS. 3A–3G.

As can be understood from FIG. 2, a logic AND signal of off-gate pulse SOFF (FIG. 3A) and Q̄ output SE of RS flip-flop 61H is supplied from AND gate 61K to the base of NPN transistor TR61. Pulse SOFF is obtained from a control circuit (not shown) for on/off controlling GTOs 1–4. The emitter of transistor TR61 is connected to a ground circuit at potential −VE1. Pulse SA (FIG. 3C), which falls to a low level when pulse SOFF rises at time t10 (FIG. 3A), is output from the collector of transistor TR61. Pulse SA is input to delay circuit 61F provided within EFD 61. Circuit 61F is a one-shot circuit which is triggered at the falling edge (t10) of pulse SA and generates, upon lapse of period Td, pulse SB having width TW (between t14 and t16 in FIG. 3D).

Reverse voltage VGK (FIG. 3F) appears across the gate G and cathode K of GTO 1, at the rising edge (t10) of off-gate pulse SOFF. Voltage VGK turns GTO 1 off. Cathode K of GTO 1 is coupled to the gate G of GTO 1 via Zener diode 61C, LED 61B provided within photo-coupler 1B, and resistor 61A. The Zener voltage V61C of diode 1C is lower than reverse voltage VGK appearing across the gate G and cathode K of GTO 1 when it is functioning normally. Hence, as long as GTO 1 operates normally, Zener diode 61C is turned on when reverse voltage VGK is generated, whereby LED 61B emits light. Optical signal S61B thus obtained is supplied to NPN transistor TR61B of photocoupler 61B. Power supply potential +VC1 is applied to the collector of transistor TR61B. The emitter of transistor TR61B is connected to NOT circuit 61D.

When off-gate pulse SOFF (FIG. 3A) is generated while GTO 1 is normally functioning, and voltage VGK appears, at time t10 (FIG. 3F), between the gate G and cathode K of GTO 1, LED 61B emits light. As a result, transistor TR61B is turned on, and the output pulse SD of NOT circuit 61D subsequently falls, at time t10 (FIG. 3B), from logic "1" level to logic "0" level. Pulse SD is supplied to the first input of NAND gate 61G. The output pulse SB (FIG. 3D) of delay circuit 61F is supplied to the second input of NAND circuit 61G.

When GTO 1 operates normally, and pulse SD is at logic "0" level, the output pulse SC (FIG. 3E) of NAND gate 61G remains at logic "1" level, even if pulse SB of logic "1" level is generated. Pulse SC is supplied to the SET input of RS flip-flop 61H. This flip-flop is not set by pulse SC at logic "1" level. Hence, its output SE (FIG. 3G) remains at logic "1" level. When reverse voltage VGK falls below Zener voltage V61C after time t12 (FIG. 3A) at which off-gate pulse SOFF falls to a low level, LED 61B stops emitting light. Consequently, pulse SD rises back to logic "1" level at time t18 (FIGS. 3B and 3F).

When GTO 1 is faulty, reverse voltage VGK*, generated at the rising edge of off-gate pulse SOFF (t20 in FIGS. 3A and 3F), remains below Zener voltage V61C. (The Zener voltage of Zener diode 61C is so selected that the Zener voltage is higher than reverse voltage VGK*.) In this case, LED 61B does not emit light, and pulse SD stays at logic "1" level even after time t20 when pulse SOFF has risen to a high level.

As long as pulse SD remains at logic "1" level, NAND gate 61G is opened when pulse SB is generated (t24 in FIG. 3D) after pulse SA has been generated (t20 in FIG. 3C). Therefore, gate 61G supplies SET pulse SC, which falls at the rising edge of pulse SB (t24 in FIG. 3E), to the SET input of flip-flop 61H. As a result, flip-flop 61H is set, and EFD 61 outputs pulse SE (i.e., fault signal S61) at logic "0" level through resistor 61I.

Flip-flop 61H is reset after countermeasures against the problems resulting from faulty GTO 1, such as the shut-down of the whole system, have been taken.

In the circuit of FIG. 2, GTO 1 is turned on by on-pulse SON supplied to the gate-cathode path of GTO 1 through AND gate 61J from an on/off control circuit (not shown). AND gate 61J opens as long as pulse SE stays at logic "1" level. Gate 61J is closed when pulse SE falls to logic "0" level upon detection of a fault in GTO 1. If this is the case, on-pulse SON is not supplied to GTO 1.

The operation of the first embodiment shown in FIG. 1 will now be explained. Suppose GTO 1 malfunctions. EFD 61 detects this fact, and stops the supply of on-pulse SON to the gate of GTO 1. Simultaneously, EFD 61 supplies fault signal S61 at logic "0" level to the base of PNP transistor 51, thereby turning on transistor 51. A current is therefore supplied via resistor 71 to LED 22 provided in photocoupler 22 of the next-stage optically-isolate circuit 12, and LED 22 emits light.

In optically-isolated circuit 12, phototransistor TR 22 is turned on when LED 22 emits light. A base current is therefore supplied to transistor 42 through resistor 32, thereby turning on transistor 42. As a result, a current is supplied through resistor 72 to LED 23, provided in photocoupler 23 of the next-stage optically isolated circuit 13.

Photocoupler 24, provided in optically-isolated circuit 14, is driven when transistor 43 is turned on. As a result, transistor 44 provided in optically isolated circuit 14 is turned on. Hence, photocoupler 25, provided in optical signal-driving circuit 15, is driven, thereby supplying a base current to transistor 45 via resistor 35. Transistor 45 is turned on, thus supplying a drive current to LED 8 through resistor 75. LED 8 outputs opticla signal S15 to light guide 10.

Signal S15 is supplied to phototransistor TR9 via light guide 10, whereby a base current is supplied via resistor 26 to transistor 46 provided in photoelectric transducer circuit 16. Circuit 16 supplies fault signal S16 to protection control circuit 17.

In the fault detector apparatus, it is sufficient that photocouplers 21-24 have a withstanding voltage higher than the potential difference between any two GTOs. It is also sufficient to connect only one optical fiber (light guide) to the arm to which GTOs (1-4) are connected in series. The apparatus does not need as many optical fibers as are necessarily used in the conventional apparatus.

Figure 4:
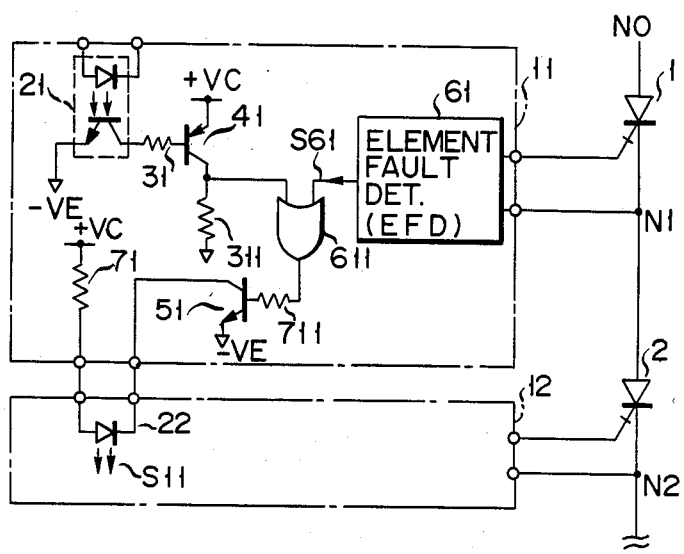
FIG. 4 illustrates the internal structure of a modification of the detector unit (11) of the detector shown in FIG. 1.

Circuits 451-454 are provided in optical insulation circuits 11-14, respectively, to provide logical sums of the fault signals and the photocoupler outputs. Circuits 451-454 can be composed of OR gate IC611, shown in FIG. 4. In this case, the output signal level of photocoupler 21, which is at logic "1" level, is converted via the circuit of PNP transistor 41 and resistor 311. IC611 provides a logical sum of the level-converted signal and output S61 from EFD 61. The output of IC611 is supplied as a base current to NPN transistor 51 through resistor 711. Transistor 51 therefore drives photocoupler 22, provided in the next-stage optical isolation circuit 12.

Figure 5:
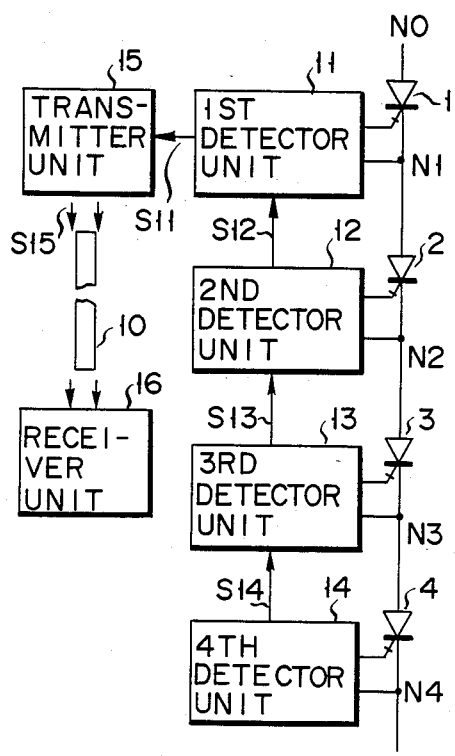
FIG. 5 shows a method of connecting the detector units (11-14) shown in FIG. 1 and the light guide (10) also shown in FIG. 1, which method is different from that used in the detector of FIG. 1.
Figure 6:
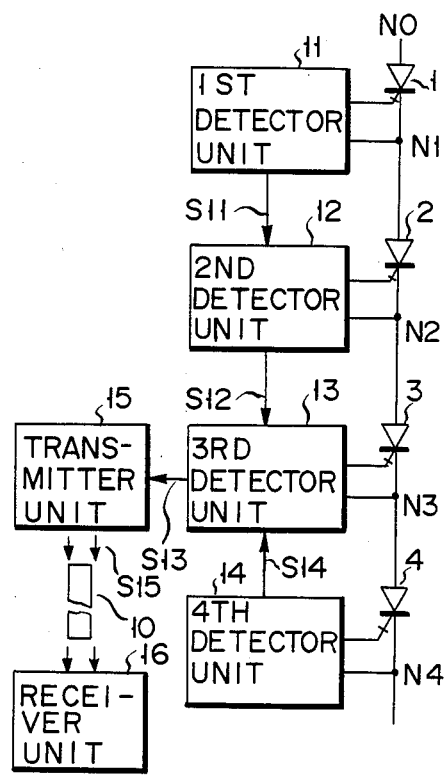
FIG. 6 shows another method of connecting the detector units (11-14) shown in FIG. 1 and the light guide (10), also shown in FIG. 1.

In the embodiment of FIG. 1, fault signals S11-S14 are transmitted from optically-isolated circuit (detector unit) 11 to optically-isolated circuit (detector unit) 14. Instead, they can be transmitted from detector unit 14 to detector unit 11, as shown in FIG. 5. Further, as shown in FIG. 6, fault signals S11-S14 can be transmitted, such that the fault signal from detector unit 11 is supplied, via detector unit 12, to detector unit 13, while detector unit 14 supplies the fault signal to detector unit 13, and unit 13 provides a logical sum of signal S12 and signal S14 so as to supply unit 15 with signal S13, to thereby reduce the time delay of transmitting signals S11-S14.

Moreover, photocouplers 21-25 can be replaced by other means such as light guides.

Fault signal S61, output from EFD 61, contains a DC component which is, as shown in FIG. 3G, at a constant level. For this reason, photocouplers 21-25, which can transmit DC data, are used in the first embodiment to connect detector units 11-14. Photocouplers 21-25 can be replaced by pulse transformers with a high withstanding voltage, provided the DC component of signal S61 is chopped by a chopper into an AC component. Alternatively, electric waves or ultrasonic waves can be used to accomplish DC-isolated coupling among units 11-14, provided there is no possibility of an erroneous transmission of data due to external disturbances. Nonetheless, photocouplers are most preferred, since they are rather inexpensive, hardly affected by external disturbances, need only a small drive power, and can have a relatively high withstanding voltage.

In the embodiments described above, detector units 11-14 are connected in series, and GTOs 1-4 are also connected in series. However, according to the present invention, these elements can be connected in parallel, or in series-parallel.

FIG. 7 shows another embodiment of the invention. In this embodiment, a unit comprising EFD 61A, OR gate 451A and DC-isolated signal coupler 22A, another unit comprising EFD 61B, OR gate 451B and DC-isolated signal coupler 22B, and still another unit comprising EFD 61C, OR gate 451C and DC-isolated signal coupler 22C, are connected in series, while three GTOs 1A to 1C are connected in parallel.

FIG. 8 shows another embodiment, wherein three GTOs 1A-1C are connected in parallel, three EFDs 61A-61C are connected to GTOs 1A-1C, respectively, OR gate 451 provides a logical sum of the outputs of EFDs 61A-61C, and this logical sum is supplied through coupler 22 to the next stage.

FIG. 9 shows still another embodiment, wherein three units, each containing two parallel-coupled GTOs, are connected in series, and detector units 22A, 22B, 23A, 23B, 24A and 24B are connected in series.

As can be understood from FIGS. 7 and 9, the GTOs can be connected in series, parallel, or series-parallel, with respect to identical detector units each comprising elements 61, 451 and 22.

As described above, according to the present invention, a plurality of detector units are provided in a high-potential section to detect whether or not any of a plurality of switching elements is faulty. In each detector unit, a logical sum of a fault signal and an output of an transistor is provided. This logical sum is transmitted to the detector unit at the next stage. Hence, the fault signal detected from any switching element can be transmitted through one light guide, provided for one arm of a thyristor bridge, to a protection control circuit provided in a low-potential section.

What is claimed is:
1. A fault detector apparatus for a power converter having N thyristors which are operated by a predetermined voltage, said apparatus comprising:
  first fault-detecting means, coupled to one of said thyristors, for generating a first fault signal when said one thyristor malfunctions;
  N−1 fault-detecting means, coupled to the remaining N−1 thyristors, respectively, for generating N−1 fault signals when any of said N−1 thyristors malfunctions;

intermediate signal-transmitting means for transmitting a DC-isolated intermediate signal, corresponding to said first fault signal, to N−1 fault-detcting means;

output means for transmitting to an external circuit a DC-isolated output signal corresponding to the logical sum of said intermediate signal, transmitted by said intermediate signal-transmitting means, and any of said N−1 fault signals of said thyristors;

said intermediate signal-transmitting means including photocouplers for transmitting intermediate signals in the form of optical signals, the number of said intermediate signals corresponding to the number of N; and said photocouplers connected in series in the order of descending potential for serially transmitting said intermediate signals, the first phtocoupler being at the highest potential.

2. A fault detector apparatus for a power converter having N thyristors which are operated by a predetermined voltage, said apparatus comprising:

first fault-detecting means, coupled to one of said thyristors, for genrating a first fault signal when said one thyristor malfuncitons;

N−1 fault-detecting means, coupled to the remaining N−1 thyristors, respectively for generating n−1 fault signals when any of siad n−1 thyistors malfunctions; transmitting a DC-isolated intermediate signal, intermediate signal-transmitting corresponding to said first fault signal, to N−1 fault-detecting means;

output means for transmitting to an external circuit a DC-isolated output signal corresponding to the logical sum of said intermediate signal, transmitted by said intermediated signal-transmitting means, and any of said N−1 fault signals of said thyristors;

said intermediate signal-transmitting means including signal couplers for transmitting intermediate signals, the number of said intermediate signals corresponding to the number of N; and said signal couplers connected in series in the order of descending potential for serially transmitting said intermediate signals, the first signal coupler being at the highest potential.

3. A fault detector apparatus for a power converter having N thyristors which are operated by a predetermined voltage, said apparatus comprising:

first fault-detecting means, coupled to one of said thyristors, for generating a first fault signal when said one thyristor malfunctions;

N−1 fault-detecting means, coupled to the remaining N−1 thyristors, respectively, for generating N−1 fault signals when any of said N−1 thyristors malfunctions;

intermediate signal-transmitting means for transmitting a DC-isolated intermediate signal, corresponding to said first fault signal, to N−1 fault-detecting means;

output means for transmitting to an external circuit a DC-isolated output signal corresponding to the logical sum of said intermediate signal, transmitted by said intermediate signal-transmitting means, and any of said N−1 fault signals of said thyristors;

said intermediate signal-transmitting means including signal couplers for transmitting intermediate signals, the number of said intermediate signals corresponding to the number of N; and said signal couplers connected in series in the order of ascending potential for serially transmitting said intermediate signals, the first signal coupler being at the lowest potential.

4. A fault detector apparatus for a power converter having N thyristor which are operated by a predetermined voltage, said apparauts comprising:

first fault-detecting means, couled to one of said thyristors, for generating a first fault signal when said one thyristor malfunctions;

N−1 fault-detecting means, coupled to the remaining N−1 thyristors, respectively, for generating N−1 fault signals when any of said N−1 thyristors malfunctions;

intermediate signal-transmitting means for transmitting a DC-isolated intermediate signal, corresponding to said first fault signal, to N−1 fault-detecting means;

output means for transmitting to an external circuit a DC-isolated output signal corresponding to the logical sum of said intermediate signal, transmitted by said intermeidate signal-transmitting means, and any of said N−1 fault signals of said thyristors;

said intermediate signal-transmitting means including photocouplers for transmitting intermediate signals in the form of optical signals, the number of said intermediate signals corresponding to the number of N; and said photocouplers connected in series in the order of ascending potential for serially transmitting said intermediate signals, the first photocoupler being at the lowest potential.

5. An apparatus according to claim 1,2, 3 or 4 wherein said output means includes one optical fiber for transmitting said output signal to said external circuit.

6. An apparatus according to claim 1,2, 3, or 4 wherein said N thyristors are connected in series, and said output means is coupled to one of said first and N−1 fault-dectecting means.

7. An apparatus according to claim 1, 2, 3 or 4 wherein said intermediate signal-transmitting means includes photocouplers in the same number as said fault-detecting means.

8. A fault detector apparatus for a power converter having a plurality of switching elements which are operated by a predetermined voltage, said apparatus comprising:

first fault-detecting means, coupled to one of said switching elements, for generating a first fault signal when this switching element malfunctions;

second fault-detecting means, coupled to another one of said switching elements, for generating a second fault signal when this switching element malfunctions;

intermediate signal-transmitting means for transmitting a DC-isolated intermediate signal, corresponding to said first fault signal;

output means for transmitting a DC-isolated output signal, corresponding to the logical sum of said intermediate signal transmitted by said intermediate signal-transmitting means and said second fault signal, to an external circuit set at a potential different from the potential of said switching elements; and said intermediate signal-transmitting means including signal couplers, connected in series, in the order of potential gradation, for transmitting said DC-isolated intermediate signal.

9. An apparatus according to claim 8, wherein said output means includes one optical fiber for transmitting said DC-isolated output signal to said external circuit.

10. An apparatus according to claim 8, wherein said intermediate signal-transmitting means includes a photocoupler for transmitting said intermediate signal in the form of an optical signal.

11. A fault detector apparatus for a power converter having arms, each containing a plurality of semi-conductor switching elements, and an electric circuit, set at a lower potential than said arms, for detecting whether or not any of said switching elements is faulty, said apparatus comprising:
- a pluraltiy of fault-detecting circuits, connected to the switching elements of each of said arms, for generating fault signals when said switching elements malfunction;
- a plurality of fault-detecting circuits, connected to cuits, connected among said fault-detecting circuits, for transmitting a DC-isolated intermediate signal, corresponding to the fault signal generated from one of said fault-detecting circuits, to another one of said fault-detecting circuits;
- a plurality of OR circuits, coupled to said fault-detecting circuits, respectively, for supplying one of said intermediate signal-transmitting circuits with a second Dc-isolated intermediate signal, which represents the logical sum of said DC-isolated intermediate signal and the fault signal generated by another one of said fault-detecting circuits;
- one light guide, provided for each of said arms, for transmitting, in the form of an optical signal, a Dc-isolated intermediate signal supplied from one of said OR circuits, as a fault detection signal, to said electric circuit; and
- said intermediate signal-transmitting circuits including signal couplers, connected in series, in the order of potential gradation, each for transmitting said DC-isolated intermediate signal.

* * * * *